(12) United States Patent
Saito et al.

(10) Patent No.: US 9,412,737 B2
(45) Date of Patent: Aug. 9, 2016

(54) IGBT WITH A BUILT-IN-DIODE

(71) Applicants: Jun Saito, Nagoya (JP); Satoru Machida, Nagakute (JP); Yusuke Yamashita, Nagoya (JP)

(72) Inventors: Jun Saito, Nagoya (JP); Satoru Machida, Nagakute (JP); Yusuke Yamashita, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/888,291

(22) PCT Filed: May 23, 2013

(86) PCT No.: PCT/JP2013/064408
§ 371 (c)(1),
(2) Date: Oct. 30, 2015

(87) PCT Pub. No.: WO2014/188569
PCT Pub. Date: Nov. 27, 2014

(65) Prior Publication Data
US 2016/0071841 A1    Mar. 10, 2016

(51) Int. Cl.
*H01L 29/732* (2006.01)
*H01L 27/07* (2006.01)
*H01L 29/739* (2006.01)
*H01L 29/872* (2006.01)
*H01L 29/06* (2006.01)
*H01L 29/36* (2006.01)
*H01L 29/423* (2006.01)

(52) U.S. Cl.
CPC ........ *H01L 27/0716* (2013.01); *H01L 27/0766* (2013.01); *H01L 29/0696* (2013.01); *H01L 29/36* (2013.01); *H01L 29/4236* (2013.01); *H01L 29/7397* (2013.01); *H01L 29/872* (2013.01)

(58) Field of Classification Search
CPC ............ H01L 27/0716; H01L 27/0755; H01L 27/0761; H01L 27/0766; H01L 29/66348; H01L 29/7397
See application file for complete search history.

(56) References Cited

U.S. PATENT DOCUMENTS

| 2003/0020134 | A1* | 1/2003 | Werner | H01L 27/0705 257/471 |
| 2005/0082640 | A1* | 4/2005 | Takei | H01L 29/0696 257/545 |
| 2012/0037955 | A1* | 2/2012 | Hirler | H01L 21/26506 257/140 |
| 2012/0043581 | A1 | 2/2012 | Koyama et al. | |
| 2012/0217541 | A1* | 8/2012 | Hsieh | H01L 29/7397 257/140 |
| 2014/0048847 | A1 | 2/2014 | Yamashita et al. | |

FOREIGN PATENT DOCUMENTS

| JP | 2012-043890 A | 3/2012 |
| JP | 2013-048230 A | 3/2013 |

* cited by examiner

*Primary Examiner* — Bryan Junge
(74) *Attorney, Agent, or Firm* — Oliff PLC

(57) ABSTRACT

When an IGBT has a barrier layer 10 that separates an upper body region 8a from a lower body region 8b, conductivity modulation is enhanced and on-resistance decreases. When the IGBT also has a Schottky contact region 6 that extends to reach the barrier layer 10, a diode structure can be obtained. In this case, however, a saturation current increases as well as short circuit resistance decreases. The Schottky contact region 6 is separated from the emitter region 4 by the upper body region 8a. By selecting an impurity concentration in the region 8a, an increase in a saturation current can be avoided. Alternatively, a block structure that prevents a depletion layer extending from the region 6 into the region 8a from joining a depletion layer extending from the region 4 into the region 8a may be provided in an area separating the region 6 from the region 4.

5 Claims, 6 Drawing Sheets

IGBT WITH A BUILT-IN-DIODE

TECHNICAL FIELD

The present specification discloses a semiconductor device that has an IGBT (Insulated Gate Bipolar Transistor) and a diode both provided in a single semiconductor substrate (this semiconductor device is called an IGBT with a built-in diode). More specifically, the present specification discloses a technique to prevent an increase in saturation current to prevent a decrease in short circuit resistance while maintaining an on-state voltage of an IGBT to be low.

BACKGROUND ART

An IGBT structurally includes an emitter region of a first conductivity type (an n-type, for example) and a drift region of the first conductivity type separated from the emitter region by a body region of a second conductivity type (a p-type, for example). As described in Patent Literature 1, a technique of inserting a barrier layer of the first conductivity type into a body region of a second conductivity type so as to divide, by the barrier layer, the body region into a part in contact with an emitter region and a part in contact with a drift region is known. According to this technique, minority carriers are suppressed from permeating into an emitter electrode from the drift region, and conductivity modulation can be enhanced to decrease resistance of the IGBT in an on-state (to decrease an on-state voltage).

Patent Literature 1 discloses another technique of incorporating an IGBT and a Free Wheeling Diode in a single semiconductor substrate to realize a Reverse-Conducting IGBT (an RC-IGBT). Yet another technique is known, in which an IGBT and a diode are incorporated in a single semiconductor substrate to prevent, for example, breakage of a gate insulating film.

CITATION LIST

Patent Literature

Patent Literature 1
Japanese Patent Application Publication No. 2012-43890

SUMMARY OF INVENTION

Technical Problem

When combining the technique of inserting a barrier layer into a body region to enhance conductivity modulation and the technique of providing an IGBT and a diode in a single semiconductor substrate, it is effective to provide a semiconductor region that extends from a front surface of the semiconductor substrate through the body region in contact with an emitter region to reach the barrier layer. Japanese Patent Application No. 2012-166576 discloses, in its specification and drawings, a technique of providing a Schottky diode that makes use of a semiconductor region of a first conductivity type that extends from a front surface of a semiconductor substrate through a body region of a second conductivity type to reach a barrier layer of the first conductivity type. This application, however, has not been published at the time of filing of the present application.

FIG. 1 schematically shows an example of an IGBT that incorporates the technique of providing a Schottky diode that makes use of a region (a Schottky contact region) extending from a front surface of a semiconductor substrate to reach a barrier layer. A reference numeral 2 denotes the front surface of the semiconductor substrate, each reference numeral 4 denotes an emitter region, each reference numeral 6 denotes a Schottky contact region, a reference numeral 8 denotes a body region, a reference numeral 10 denotes a barrier layer, a reference numeral 12 denotes a drift region, a reference numeral 14 denotes a collector region, each reference numeral 16 denotes a gate electrode, each reference numeral 18 denotes a gate insulating film, and a reference numeral 20 denotes a back surface of the semiconductor substrate. The emitter regions 4, the Schottky contact regions 6, the bather layer 10, and the drift region 12 have a first conductivity type (an n-type, for example), while the body region 8 and the collector region 14 have a second conductivity type (a p-type, for example). The body region 8 is divided by the barrier layer 10 into an upper body region 8a in contact with the emitter regions 4 and a lower body region 8b in contact with the drift region 12. Each Schottky contact region 6 extends from the front surface 2 of the semiconductor substrate through the upper body region 8a to reach the bather layer 10. An emitter electrode (not shown) is provided on the front surface 2 of the semiconductor substrate. The emitter electrode is in Ohmic contact with the emitter regions 4 and the upper body region 8a, is in Schottky contact with the Schottky contact regions 6, and is insulated from the gate electrodes 16 by corresponding gate insulating films 18. A collector electrode (not shown) is provided on the back surface 20 of the semiconductor substrate. The collector electrode is in Ohmic contact with the collector region 14. The emitter electrode is an anode electrode of the Schottky diode, while the collector electrode is a cathode electrode of the Schottky diode.

Usually in the semiconductor in use, the emitter electrode is grounded, and positive voltage is being applied to the collector electrode. This state is equivalent to a state in which the Schottky diode is reverse biased. In the following, the first conductivity type refers to an n-type and the second conductivity type refers to a p-type. While positive voltage is being applied to the gate electrodes 16, a conductivity type of a part of the body region 8 that faces the gate electrodes 16 via the respective gate insulating films 18 is inverted into the n-type. As a result, the respective emitter regions 4, the upper body region 8a thus inverted, the barrier layer 10, the lower body region 8b thus inverted, and the drift region 12 become electrically connected with each other, allowing electrons to flow from the emitter electrode into the drift region 12. This accordingly allows holes to flow from the collector electrode through the collector region 14 into the drift region 12 such that conductivity modulation occurs in the drift region 12 and therefore the emitter and the collector become electrically connected with each other. Because of this conductivity modulation, an on-state voltage is low. The presence of the bather layer 10 inhibits permeation, into the emitter electrode, of holes that have flowed into the drift region 12, enhancing the conductivity modulation and further decreasing the on-state voltage. When application of positive voltage to the gate electrode 16 is stopped, an inversion layer that has been generated in the body region 8 disappears and the electrical connection thus generated between the emitter and the collector is cut off. An IGBT is formed by the emitter regions 4, the upper body region 8a, the barrier layer 10, the lower body region 8b, the drift region 12, the collector region 14, the gate electrodes 16, the gate insulating films 18, and the like.

When the electrical connection between the emitter and the collector is cut off, an induction component of a load circuit that is connected to the IGBT makes an electric potential of the emitter electrode higher than an electric potential of the collector electrode. In this case, a Schottky interface between the emitter electrode (the anode electrode of the diode) and each Schottky contact region 6 is forward biased and accordingly a forward current flows through the Schottky diode. As a consequence, the Schottky diode operates as a Free Wheeling Diode. When an influence of the induction component has been eliminated and the electric potential of the emitter electrode has become lower than the electric potential of the collector electrode, the Schottky interface between the emitter electrode and the Schottky contact region 6 is reverse biased and accordingly the current is blocked from flowing between the emitter electrode and the Schottky contact region 6. A Schottky diode is formed by the emitter electrode, the Schottky contact region 6, and the like. In this example, the Schottky diode operates as a Free Wheeling Diode. In a different example, an IGBT may incorporate a diode to prevent a gate insulating film 18 from being damaged due to an increase in voltage between the emitter and the collector.

The IGBT with a built-in diode having the barrier layer 10 and the Schottky contact regions 6 has properties of having a low resistance between the collector and the emitter when the IGBT is in on-state and having a low leakage current, and therefore has low loss characteristics. The IGBT with a built-in diode having the barrier layer 10 and the Schottky contact regions 6, however, has a problem of having high saturation current and therefore is easily damaged when short-circuit occurs in the load circuit or the like. The present specification provides an IGBT with a built-in diode which is less likely to be damaged while making use of the barrier layer 10 and the Schottky contact regions 6.

The technique described in the present specification has been developed based on an analysis on why improvement of properties by making use of the barrier layer 10 and the Schottky contact regions 6 can lead to decrease in short circuit resistance. In FIG. 1, an arrow A shows a current path extending through the inversion layer generated while the IGBT is in on-state. In an IGBT with no diode incorporated therein, the current path shown by the arrow A is the only current path generated. Besides, an arrow B shows a current path extending from the inversion layer generated in the lower body region 8b through both the barrier layer 10 and the Schottky contact region 6 to reach the emitter region 4. When a diode is incorporated by making use of the barrier layer 10 and the Schottky contact regions 6, this new current path B is generated. Despite the presence of the upper body region 8a of the opposite conductivity type between the Schottky contact regions 6 and the emitter regions 4, a current flows from the Schottky contact regions 6 through the upper body region 8a into the emitter regions 4, according to actual measurement. It should be noted that, while the IGBT is in on-state, reverse bias is applied between the Schottky contact regions 6 and the emitter electrode and therefore no current flows from the Schottky contact regions 6 into the emitter electrode.

The upper body region 8a is formed by implanting impurities from the front surface 2 of the semiconductor substrate and then diffusing the implanted impurities. The implantation of the impurities is conducted with such an amount of energy that allows the impurities to reach a certain depth from the front surface 2, and therefore an impurity concentration in the vicinity of the front surface 2 is lower than an impurity concentration at the certain depth from the front surface. It has been found that, when a current flows from the Schottky contact regions 6 through the upper body region 8a into the emitter regions 4, the current flows along a front surface of the upper body region 8a where the impurity concentration of the opposite conductivity type is relatively low, preferentially than through a deep area in the upper body region 8a where a relatively high concentration of impurities of the opposite conductivity type is contained. More specifically, it has been found that, at a position along the front surface of the upper body region 8a with the low impurity concentration, a depletion layer extending from the Schottky contact regions 6 to the upper body region 8a joins a depletion layer extending from the emitter regions 4 to the upper body region 8a to give rise to punchthrough, and the presence of the punchthrough allows a current to flow from the Schottky contact regions 6 through the upper body region 8a into the emitter regions 4.

FIG. 2 shows a relationship between an emitter-collector voltage and an emitter-collector current. A curve C1 indicates a result of measurement on an IGBT with no diode incorporated, while a curve C2 indicates a result of measurement on an IGBT with a diode incorporated which makes use of the barrier layer 10 and the Schottky contact regions 6. The IGBT with no diode incorporated has a saturation current of $I_A$, while the IGBT having the barrier layer 10 and the Schottky contact region 6 has a higher saturation current that is $I_A+I_B$. According to the analysis result, it has been confirmed that $I_A$ is attributed to a current that flows in the current path shown by the arrow A, and $I_A$ is attributed to a current that flows in the current path shown by the arrow B. It has been found that, when the barrier layer 10 and the Schottky contact region 6 are provided, the current path B is generated and therefore the saturation current increases.

In FIG. 2, $V_{CC}$ indicates a power supply voltage applied to the IGBT and to the load circuit. When a short-circuit occurs in the load circuit, the power supply voltage of $V_{CC}$ is applied to the IGBT. When the short-circuit thus occurs in the load circuit, energy of an amount of the saturation current multiplied by the power supply voltage (W=J/sec) is generated in the semiconductor device per unit time, and accordingly the IGBT with a built-in diode generates heat. It has been found that, when the barrier layer 10 and the Schottky contact regions 6 are provided, the energy generated in the IGBT with a built-in diode at the time of a short-circuit is increased from $V_{CC} \times I_A$ to $V_{CC} \times (I_A+I_B)$. It has been found that when the barrier layer 10 and the Schottky contact regions 6 are provided, an amount of heat generated per unit time increases, accordingly a speed at which a temperature of the IGBT with a built-in diode rises increases, consequently a time taken to reach a temperature at which the semiconductor device is damaged is shortened, and therefore the short circuit resistance decreases.

The present specification discloses a technique of improving properties of a semiconductor device by making use of the barrier layer and the Schottky contact region while rendering the IGBT with a built-in diode less likely to be damaged.

Solution to Problem

According to the results of the aforementioned analysis, it has been found that a decrease in short circuit resistance of a conventional IGBT with a built-in diode is caused by a punchthrough occurring between a Schottky contact region and an emitter region in the vicinity of a front surface of an upper body region. The present specification discloses a technique of preventing the occurrence of a punchthrough so as to prevent the decrease in short circuit resistance.

(First Solution)

A punchthrough occurs when a sum (hereinafter, a total distance) of a distance of a depletion layer extending from the Schottky contact region into the upper body region and a distance of a depletion layer extending from the emitter region into the upper body region is equal to or exceeds a distance between the Schottky contact region and the emitter region. The total distance depends on a potential difference between the Schottky contact region and the emitter region (while the Ian is in on-state, since the reverse bias is applied between the emitter electrode and the Schottky contact region, an electric potential of the Schottky contact region is different from an electric potential of the emitter electrode (which is equal to an electric potential of the emitter region)), and also depends on an amount of charges present in the upper body region. When the potential difference is large, the total distance is long, while when the amount of charges is large, the total distance is short. The potential difference can be grasped by measurement and/or analysis. As long as the amount of charges is adjusted so as to satisfy a relationship "a total distance at a potential difference<a distance between the Schottky contact region and the emitter region", the occurrence of punchthrough can be prevented. Usually, monovalent ions are implanted to adjust a conductivity type of the upper body region. In this case, the amount of charges is proportional to an impurity concentration.

Here, W that is a distance of a depletion layer extending into the upper body region, N that is an impurity concentration in the upper body region, and V that is a voltage difference between the Schottky contact region and the emitter region have a relationship defined by a formula:

$$W^2 = 2 \cdot Es \cdot (Vbi - V)/(q \cdot N) \quad (1)$$

in the formula, Es denotes a dielectric constant of the semiconductor, Vbi denotes a built-in potential, and q denotes an elementary charge.

With the distance between the Schottky contact region and the emitter region being L, it is understood that when a relationship:

$$N > 2 \cdot Es \cdot (Vbi - V)/(q \cdot L^2) \quad (2)$$

derived from the formula (1) is satisfied, a relationship W<L is satisfied and therefore it is possible to obtain a result where the occurrence of punchthrough between the Schottky contact region and the emitter region can be avoided. In the formula (2), Es as the dielectric constant and q as the elementary charge are known, and it is possible to measure Vbi as the built-in potential, L as the distance between the Schottky contact region and the emitter region, and V as the voltage difference between the Schottky contact region and the emitter region. Accordingly, from the formula (2), an impurity concentration required to avoid the occurrence of punchthrough between the Schottky contact region and the emitter region can be determined.

As described above, in the prior art document cited above, the impurity concentration in the vicinity of the front surface of the upper body region is too low to satisfy the relationship defined by the formula (2). By increasing the concentration, it is possible to obtain the result where the occurrence of punchthrough between the Schottky contact region and the emitter region can be avoided. When the concentration is thus increased, it is possible to obtain a result where the generation of the current path shown by the arrow B in FIG. 1 can be avoided, accordingly a problem of the increase in saturation current can be avoided, consequently the increase in speed at which a temperature rises at time of a short-circuit can be avoided, and therefore the decrease in short circuit resistance can be avoided.

When an impurity concentration at least in the vicinity of the front surface of upper body region is increased such that no punchthrough occurs between the Schottky contact region and the emitter region, the short circuit resistance does not decrease even when the barrier layer and the Schottky contact region are provided.

(Second Solution)

Alternatively, a region to prevent the occurrence of punchthrough may be provided between the Schottky contact region and the emitter region. For example, an insulating region may be provided in the front surface of the upper body region that is located between the Schottky contact region and the emitter region, the insulating region extending in a depth direction from the front surface. Instead of the insulating region, a combination of a trench gate electrode and a gate insulating film may be provided. Alternatively, a region in which an impurity concentration is higher than an impurity concentration in the rest of the upper body region may be provided in the vicinity of the front surface of the upper body region. In any of these cases, the depletion layer extending from the Schottky contact region into the upper body region is blocked from being joined with the depletion layer extending from the emitter region into the upper body region, and therefore the occurrence of punchthrough is prevented. Any of these block regions may essentially be formed so as to extend across an area where punchthrough is to occur, may not need to extend over an entire depth of the upper body region, and may not need to surround entire areas of the Schottky contact region and/or the emitter region.

Advantageous Effects of Invention

The technique described in the present specification provides the following:

(1) By making use of a barrier layer, permeation of minority carriers from a drift region into an emitter electrode can be suppressed, and conductivity modulation can be enhanced.

(2) A Schottky diode structure which makes use of the emitter electrode (to serve as a Schottky electrode), a Schottky contact region, and the barrier layer can be formed.

(3) While an IGBT is electrically conducting, generation of a current path extending from the barrier layer through both the Schottky contact region and an upper body region to reach an emitter region can be inhibited, and an increase in saturation current can be suppressed. A decrease in short circuit resistance can be prevented.

DESCRIPTION OF EMBODIMENTS

The following is list of some of characteristics of embodiments to be described below.

(Characteristics of First Embodiment) No region where a composition thereof is different from a composition of an upper body region is provided in a part of the upper body region that separates a Schottky contact region from an emitter region. An impurity concentration in the upper body region is uniform throughout the part that separates the Schottky contact region from the emitter region.

(Characteristics of Second Embodiment) In an upper body region of a p-type, another p-type region in which an impurity concentration is higher than an impurity concentration in the upper body region of the p-type is provided. This high-concentration p-type region surrounds a Schottky contact region in a plan view of a semiconductor substrate.

(Characteristics of Fifth Embodiment) A combination of an insulating material provided inside of a trench and a high-concentration p-type region surrounds a Schottky contact region.

EMBODIMENTS

The following embodiments will describe details of the technique disclosed in the present specification and further improvements to the technique.

First Embodiment

Figure 1:
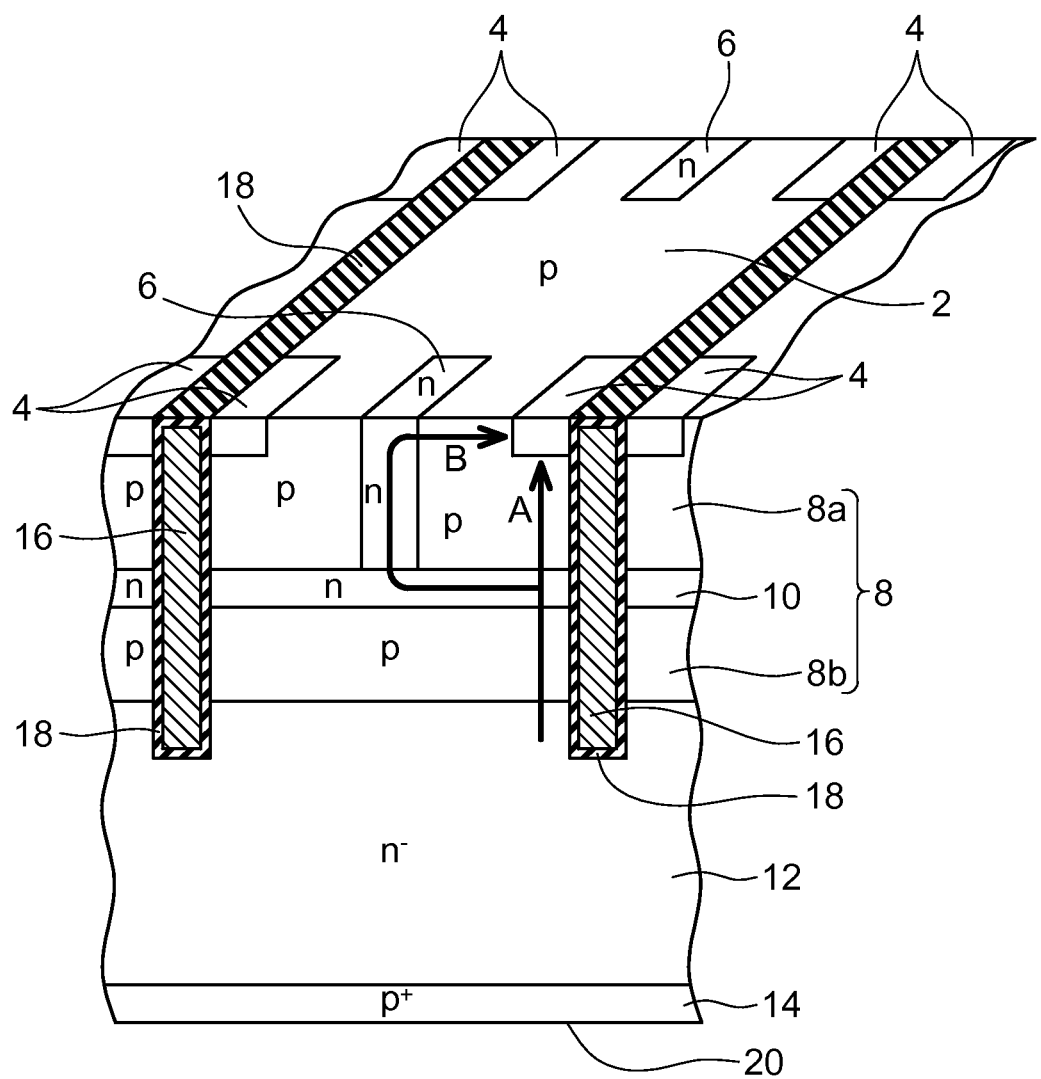
FIG. 1 schematically shows a semiconductor structure of an IGBT with a built-in diode.
Figure 2:
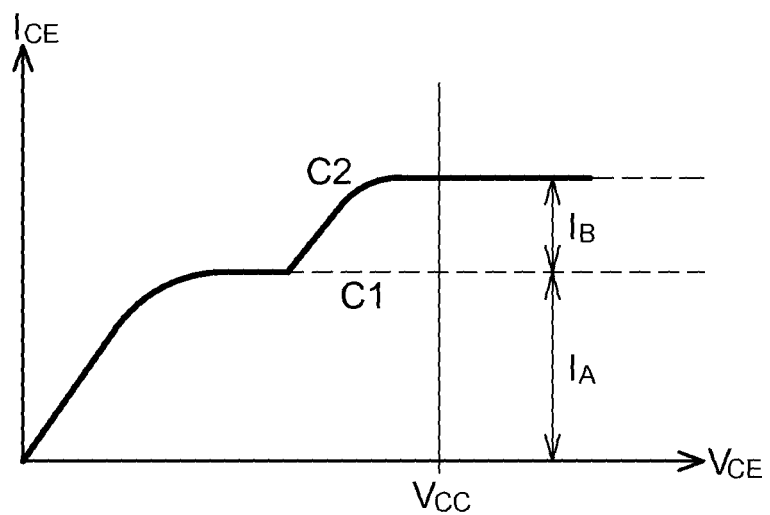
FIG. 2 shows saturation current when a barrier layer and a Schottky contact region are provided and saturation current when neither a barrier layer nor a Schottky contact region is provided.

A semiconductor structure according to First Embodiment is the same as the semiconductor structure shown in FIG. 1. Descriptions overlapping the matters already described will be omitted. As shown in FIG. 1, no region of which composition is different from a composition of an upper body region 8a is provided in a range of the upper body region 8a that separates each Schottky contact region 6 from a corresponding emitter region 4. The semiconductor structure according to First Embodiment is the same as the semiconductor structure shown in FIG. 1. In an IGBT with a built-in diode according to First Embodiment, an impurity concentration in the upper body region 8a in the vicinity of a front surface 2 of a semiconductor substrate is high so as to prevent punchthrough from occurring between the Schottky contact region 6 and the emitter region 4. Accordingly, a decrease in short circuit resistance is prevented. A block region that prevents a depletion layer from reaching a collector region 14 may be provided between a drift region 12 and the collector region 14. The block region will be described in Second Embodiment.

In FIG. 1, in a plan view of the front surface 2 of the semiconductor substrate, a shortest distance between the Schottky contact region 6 and the emitter region 4 is denoted as L, and an impurity concentration in the vicinity of the front surface of the upper body region 8a is denoted as N. The impurities are monovalent impurities. In this case, when N as the impurity concentration satisfies a relationship defined by the following formula, no punchthrough occurs between the Schottky contact region 6 and the emitter region 4.

$$N > 2 \cdot Es \cdot (Vbi - V)/(q \cdot L^2) \quad (2)$$

In the formula, Es denotes a dielectric constant of a semiconductor, Vbi denotes a built-in potential, and q denotes an elementary charge.

In the IGBT with a built-in diode according to First Embodiment, N as the impurity concentration in the upper body region 8a in the vicinity of the front surface 2 of the semiconductor substrate satisfies the relationship defined by the formula (2), preventing punchthrough from occurring between the Schottky contact region 6 and the emitter region 4. Accordingly, the decrease in short circuit resistance is prevented.

When an on-state gate voltage of the IGBT is denoted as Vg and a threshold voltage of the IGBT is denoted as Vth, a potential difference between the Schottky contact region 6 and the barrier layer 10 does not exceed Vg-Vth. When Vg=15 V and Vth=6 V, Vg−Vth=9 V. Therefore, from the formula (2), an amount of charges (L·N) required to prevent the occurrence of punchthrough is determined to be 1.2E12 cm$^{-2}$. Based on this, N as the impurity concentration and L as the distance can accordingly be determined.

Second Embodiment

Figure 3:
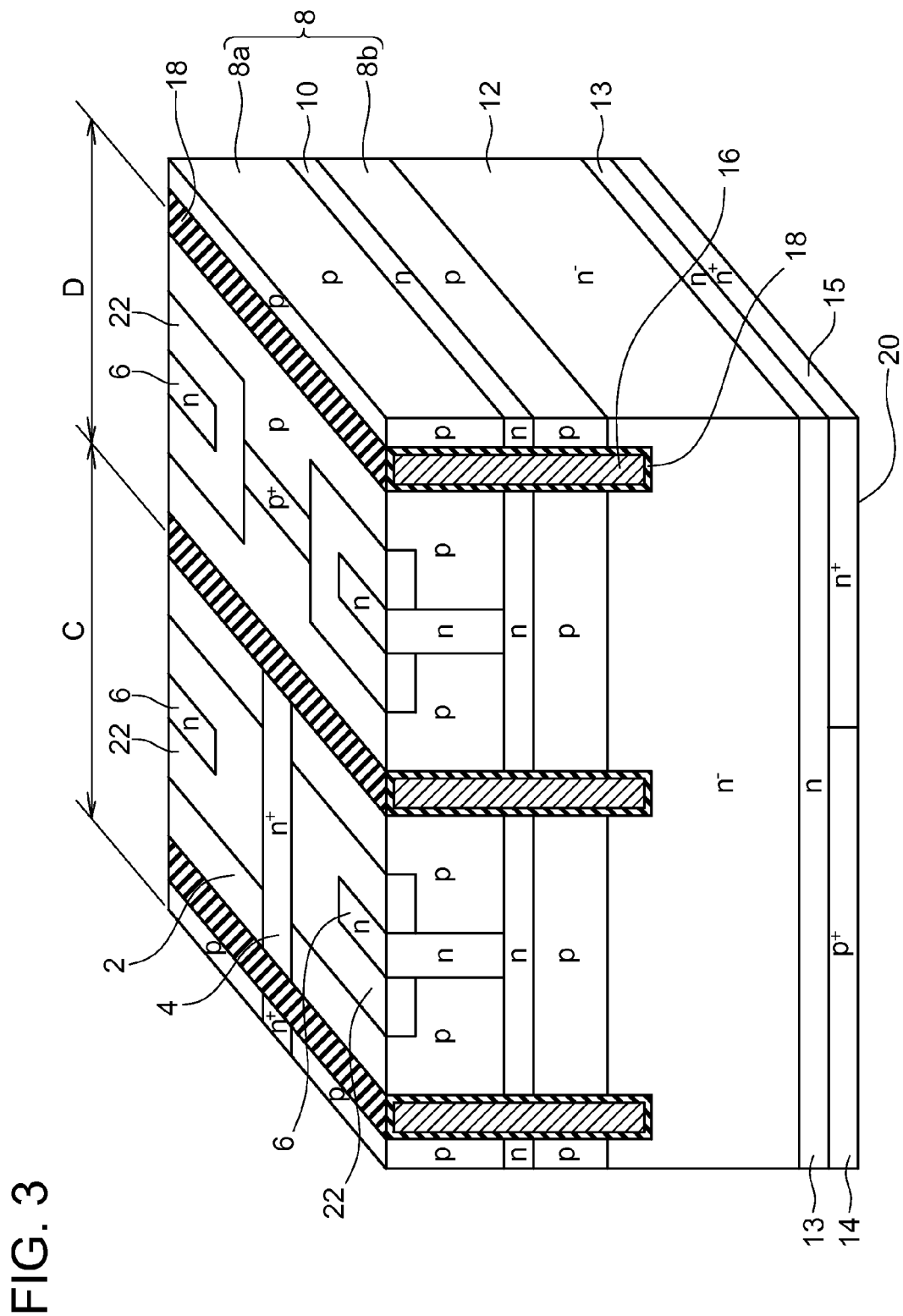
FIG. 3 schematically shows a semiconductor structure of an IGBT with a built-in diode according to Second Embodiment.
Figure 4:
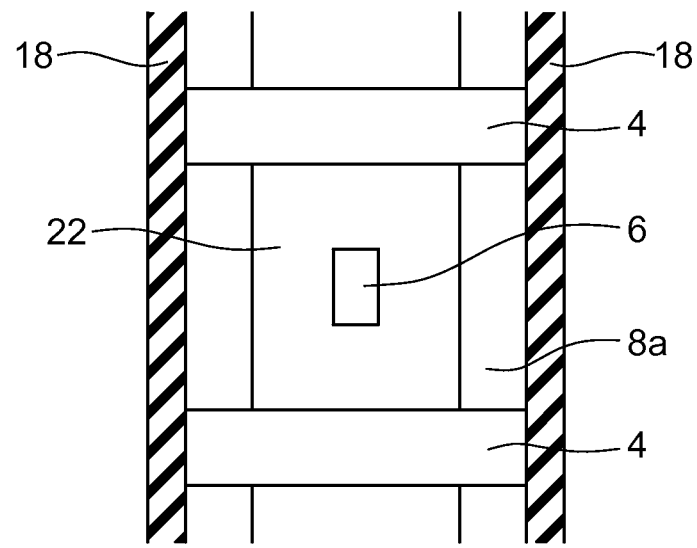
FIG. 4 is a plan view of the IGBT with a built-in diode in FIG. 3.

Second Embodiment will be described with reference to FIG. 3 and FIG. 4. In the following, differences from FIG. 1 will be solely described, with overlapping descriptions omitted. In an IGBT with a built-in diode according to Second Embodiment, a section C in which both a diode and an IGBT are provided and a section D in which only a diode is provided are arranged alternately. In the section C, both an emitter region 4 and Schottky contact regions 6 are provided. In Second Embodiment, the emitter region 4 and the Schottky contact regions 6 are provided at different positions in a longitudinal direction of gate electrodes 16. In the vicinity of a front surface of a p-type upper body region 8a, high-concentration regions 22 in which a concentration of p-type impurities is higher than a concentration of p-type impurities in the p-type upper body region 8a is provided. In a plan view of a front surface 2 of a semiconductor substrate, each high-concentration region 22 is provided in an area surrounding the corresponding Schottky contact region 6. The high-concentration region 22 is provided in an area in the vicinity of the front surface of the upper body region 8a and that separates the corresponding Schottky contact region 6 from the emitter region 4. With the high-concentration region 22 provided, a presence of the high-concentration region 22 can satisfy the relationship defined by the formula (2). Accordingly, an impurity concentration in the upper body region 8a can be controlled as desired. For example, by decreasing an impurity concentration in a body region 8, a threshold voltage of the IGBT can be decreased. In addition, with the high-concentration region 22 provided, the occurrence of punchthrough can be prevented even when a shortest distance between each Schottky contact region 6 and the emitter region 4 is as short as L, allowing reduction of a size of a device.

In Second Embodiment, between a drift region 12 and a collector region 14, a block region 13 that prevents a depletion layer from reaching the collector region 14 is provided. The block region 13 is a region into which n-type impurities have been implanted at a high concentration.

In the section D in which only the diode is provided, no emitter region 4 is provided and, instead of a p-type collector region 14, an n-type cathode region 15 is provided. In the section D, no emitter region is provided and therefore no high-concentration region 22 is required. Even though it is not required, the high-concentration region 22 may alternatively be provided in the same manner as in the section C.

The high-concentration region 22 is in Ohmic contact with an emitter electrode, and accordingly an electric potential of the body region 8 equals to an electric potential of the emitter electrode. When the electric potential of the body region 8 becomes stable, operation of the IGBT becomes stable. The high-concentration region 22 prevents punchthrough from occurring between the emitter region 4 and the Schottky contact region 6, and serves as a body contact region that makes the electric potential of the body region 8 stable.

Third Embodiment

Figure 5:
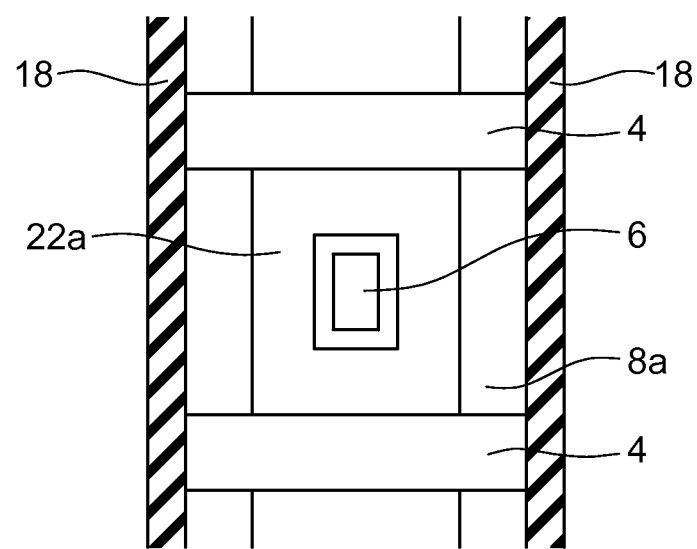
FIG. 5 is a plan view of an IGBT with a built-in diode according to Third Embodiment.

As shown in FIG. 5, a high-concentration region 22a may simply be provided in an area in the vicinity of a front surface 2 of a semiconductor substrate that separates a Schottky contact region 6 from an emitter region 4, and may be provided in an area that is apart from the Schottky contact region 6. The Schottky contact region 6 and the high-concentration region 22a have opposite conductivity types. By arranging the Schottky contact region 6 and the high-concentration region 22a to be apart from each other, it is possible to prevent respective areas where impurities are implanted from overlapping each other due to tolerances at time of fabrication, allowing easy optimization of an impurity concentration in the Schottky contact region 6 and of an impurity concentration in the high-concentration region 22a, respectively. In addition, by arranging the Schottky contact region 6 and the high-concentration region 22a to be apart from each other, variation in a size of the Schottky contact region 6 potentially caused by fabrication of the high-concentration region 22a is prevented.

Fourth Embodiment

Figure 6:
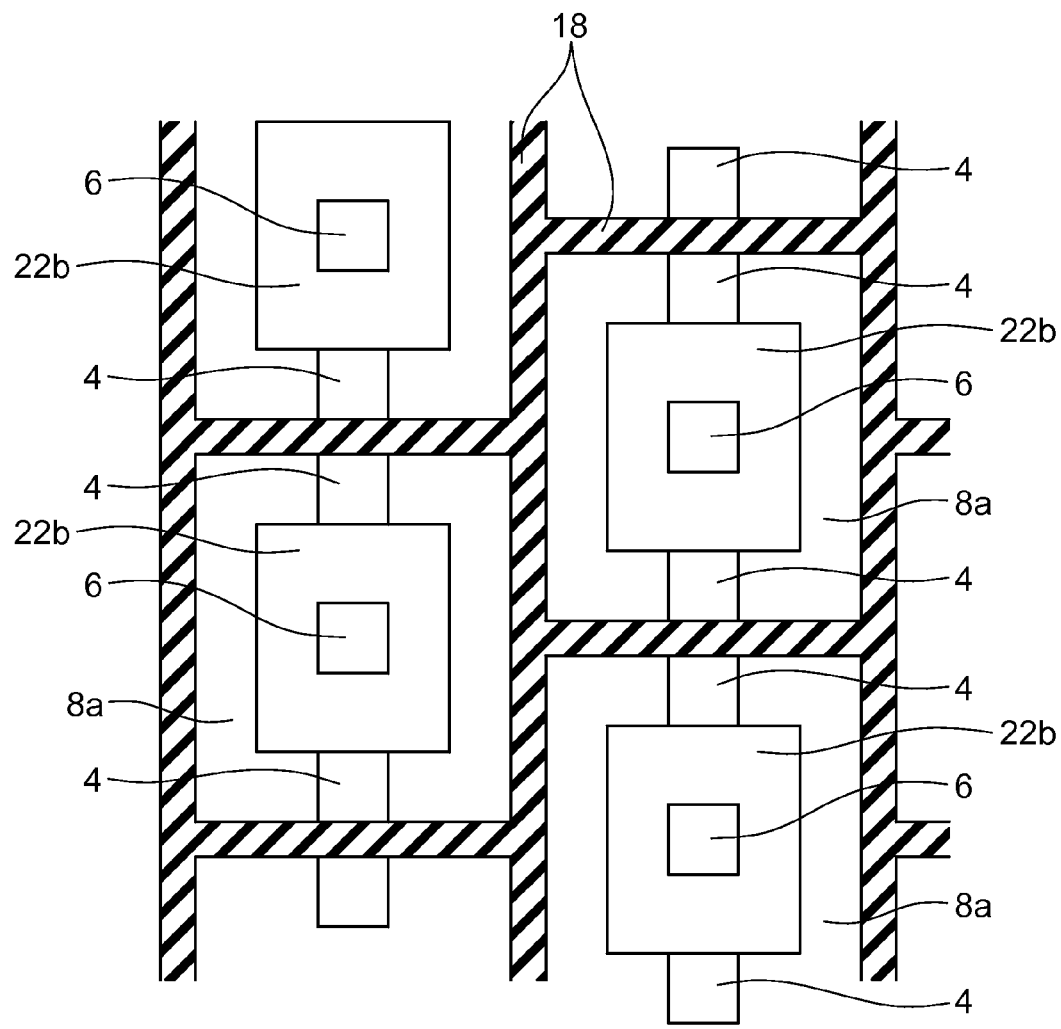
FIG. 6 is a plan view of an IGBT with a built-in diode according to Fourth Embodiment.

As shown in FIG. 6, a gate electrode 16 and a gate insulating film 18 may extend in a grid-like shape on a front surface 2 of a semiconductor substrate. In this case, high-concentration regions 22b each having a shape shown in FIG. 6 may be provided.

Fifth Embodiment

Figure 7:
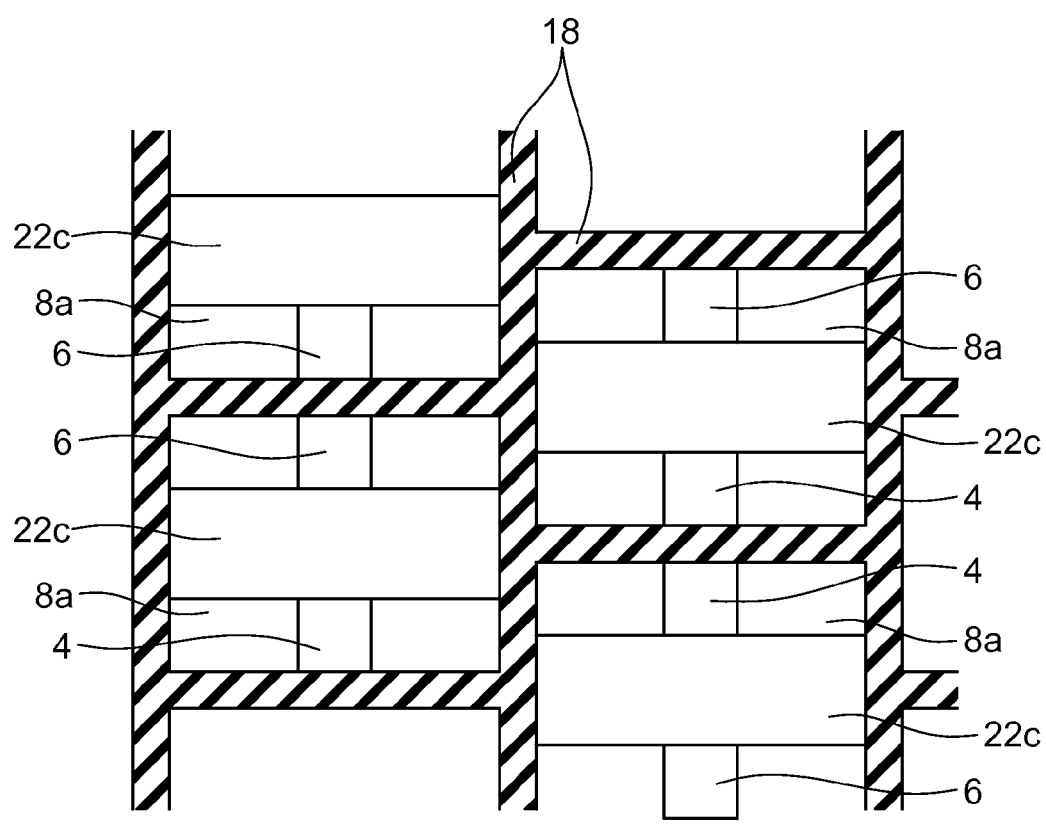
FIG. 7 is a plan view of an MT with a built-in diode according to Fifth Embodiment.

As shown in FIG. 7, combinations of a high-concentration region 22c and a gate insulating film 18 may be each provided to separate each Schottky contact region 6 from a corresponding emitter region 4. Since both of the high-concentration region 22c and the gate insulating film 18 can stop a depletion layer extending further, use of the combination of the high-concentration region 22c and the gate insulating film 18 can prevent punchthrough from occurring between the Schottky contact region 6 and the emitter region 4.

Sixth Embodiment

Although not illustrated, instead of the high-concentration regions 22, 22a, 22b, and 22c shown in FIG. 3 to FIG. 7, an insulating film covering a wall surface of a trench may be provided. Also in this case, punchthrough can be prevented from occurring between a Schottky contact region 6 and an emitter region 4. A thin insulating film can sufficiently work for preventing punchthrough, therefore allowing size reduction of a device.

Seventh Embodiment

When the trench according to Sixth Embodiment is provided, inside of the trench may be filled with an insulating material, or the trench may be covered with an insulating film on a wall surface thereof and inside of the trench may be filled with a conductive material. In the latter case, a gate insulating film is provided to separate a Schottky contact region 6 from an emitter region 4.

Representative, non-limiting examples of the present invention have been described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

While embodiments of the present invention have been described above in detail, these embodiments are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

REFERENCE SIGNS LIST

2: front surface of semiconductor substrate
4: emitter region
6: Schottky contact region
8: body region
8a: upper body region
8b: lower body region
10: barrier layer
12: drift region
13: block region
14: collector region
15: cathode region
16: gate electrode
18: gate insulating film
20: back surface of semiconductor substrate
22, 22a, 22b, 22c: high-concentration region

The invention claimed is:
1. An IGBT with a built-in diode, having an emitter region, an upper body region, a barrier layer, a lower body region, a drift region, and a collector region disposed in a semiconductor substrate in this order, and comprising an IGBT structure and a Schottky diode structure, wherein
in the IGBT structure:
a trench extending from a front surface of the semiconductor substrate through the emitter region, the upper body region, the barrier layer, and the lower body region to reach the drift region is provided, a wall surface of the trench is covered with an insulating film, a gate electrode is disposed within the trench including the wall surface covered with the insulating film, an emitter electrode configured to electrically connect with the emitter region is provided on the front surface of the semiconductor substrate, and a collector electrode configured to electrically connect with the collector region is provided on a back surface of the semiconductor substrate, in the Schottky diode structure, a Schottky contact region extending through the upper body region to reach the barrier layer, and being in a Schottky contact with the emitter electrode is provided, the Schottky contact region and the emitter region are separated by the upper body region at a separating portion on the front surface of the semiconductor substrate, and an impurity concentration in the separating portion is set to a concentration which satisfies a following relationship: "a distance of a depletion layer extending in the separating portion<a separated distance between the Schottky contact region and the emitter region".

2. An IGBT with a built-in diode according to claim 1, further having a high-concentration region in an area on a front surface side in the upper body region and that separates the Schottky contact region from the emitter region, wherein an impurity concentration of the high-concentration region is higher than an impurity concentration of the upper body region with a same conductivity type as a conductivity type of the high-concentration region.

3. An IGBT with a built-in diode according to claim 2, wherein the high-concentration region surrounds the Schottky contact region in a plan view of the semiconductor substrate.

4. An IGBT with a built-in diode, having an emitter region, an upper body region, a barrier layer, a lower body region, a drift region, and a collector region disposed in a semiconductor substrate in this order, and comprising an IGBT structure and a Schottky diode structure, wherein in the IGBT structure:

a trench extending from a front surface of the semiconductor substrate through the emitter region, the upper body region, the barrier layer, and the lower body region to reach the drift region is provided, a wall surface of the trench is covered with an insulating film, a gate electrode is disposed within the trench including the wall surface covered with the insulating film, an emitter electrode configured to electrically connect with the emitter region is provided on the front surface of the semiconductor substrate, and a collector electrode configured to electrically connect with the collector region is provided on a back surface of the semiconductor substrate, in the Schottky diode structure, a Schottky contact region extending through the upper body region to reach the barrier layer, and being in a Schottky contact with the emitter electrode is provided, the Schottky contact region and the emitter region are separated by the upper body region at a separating portion on the front surface of the semiconductor substrate, and the separating portion includes a block region which blocks between a depletion layer extending from the Schottky contact region into the separating portion and a depletion layer extending from the emitter region into the separating portion.

5. An IGBT with a built-in diode according to claim 4, wherein the block region is an insulating region in a front surface of the upper body region that is located between the Schottky contact region and the emitter region, extending in a depth direction from the front surface of the upper body region.

* * * * *